United States Patent

Nugent et al.

[15] 3,683,146

[45] Aug. 8, 1972

[54] METHODS FOR ASSEMBLING SOLID STATE DEVICES

[72] Inventors: Reginald F. Nugent, Yardley, Pa.; George P. Snyder, Trenton, N.J.

[73] Assignee: Time Research Laboratories, Inc., Pennington, N.J.

[22] Filed: Aug. 4, 1969

[21] Appl. No.: 847,374

[52] U.S. Cl. .........................219/85, 29/589, 29/503

[51] Int. Cl. .............................................B23k 1/06

[58] Field of Search................29/588, 589, 625, 628; 219/339, 85, 347; 228/1; 156/73, 272

[56] References Cited

UNITED STATES PATENTS

| | | | |
|---|---|---|---|
| 3,462,540 | 8/1969 | Harris, Jr. et al. | ........29/626 X |
| 3,404,213 | 10/1968 | Brookover et al. | .......29/588 X |
| 3,340,602 | 9/1967 | Hontz | ..........................29/588 |
| 3,283,124 | 11/1966 | Kawecki | ................219/340 X |
| 3,165,818 | 1/1965 | Soffa et al. | ...................29/589 |

*Primary Examiner*—John F. Campbell
*Assistant Examiner*—W. Tupman
*Attorney*—Frederick J. Olsson

[57] ABSTRACT

Methods for hermetically sealing the lids of flat packs and for soldering the spacers in stacks to the pins and to the conductors on the substrates with infra-red and mechanical energy.

5 Claims, 5 Drawing Figures

INVENTORS
REGINALD F. NUGENT
BY GEORGE P. SNYDER

FREDERICK J. OLSSON
ATTORNEY

INVENTORS
REGINALD F. NUGENT
GEORGE P. SNYDER
BY

FREDERICK J. OLSSON
ATTORNEY.

METHODS FOR ASSEMBLING SOLID STATE DEVICES

This invention relates in general to the manufacture or assembly of electronic, solid state devices.

More particularly the invention relates to methods for connecting at least two components of electronic solid state devices by a bonding agent bonded on the surfaces of the components.

Communications and control equipment for aircraft and space vehicles, military needs in communications and for equipment control, industrial power control equipment and the extensive and ever increasing application of computers and solid state techniques to industrial, educational and scientific disciplines have long called for and necessitated the miniaturization of electronic components.

Single function solid state devices such as transistors, SCR's and the like have made a significant contribution to the miniaturization objective. In recent years there has been a substantial effort toward micro-miniaturization particularly as by combining several functions into a single device.

One such multi-function device has been the so-called flat pack in which solid state wafers or chips are fixed on a hollow base and connected to terminals extending out of the base with the hollow base being provided with a cover or a lid to seal in the wafer.

It is vitally important in flat packs that the seal between the lid and the base be hermetic, otherwise, the chip or wafer will fail under use.

These highly desirable and long needed devices have not had the fullest acceptance nor used in applications ideally suitable for such devices. This is directly attributable to the high cost of manufacture.

A significant problem has long existed with respect to the obtaining of a true hermetic seal. Thus, in the manufacture of flat packs by conventional techniques the failure to consistently obtain hermetic seals has resulted in yields in the order of 40 – 60 percent. Furthermore, conventional techniques are not really compatible to high production rates. With low yields and low production rates, the cost is high.

One of the primary objects of the present invention is to provide methods for obtaining true hermetic seals in flat packs and for maintaining yields approaching 100 percent and accomplishing the same at high production rates.

Another device which has been developed in the quest of micro-miniaturization is the so-called stack. This device has a plurality of substrates stacked one above another in hotel floor-like fashion and each substrate carries several multi-function chips which are electrically connected to upstanding terminal pins engaged with the substrates. The means for electrically connecting the terminal pins and conductors contemplates a solder disc on a terminal pin in contact with a conductor on the substrate. The solder is bonded to both the pin and conductor. There may be as many as 50 of such solder coated discs in a stack. A typical stack may enclose an area of about one half inch square and an 1 inch high and is a relatively complex array capable of performing several hundred electrical functions.

This sophisticated and astounding device has not been utilized because of the enormous manufacturing cost except in limited circumstances where cost is no object. This has been due directly to the inability to solve the seemingly simple problem of connecting the solder coated discs to the pins and conductors. The inability to consistently make the mandatory connection between the pins and conductors has resulted in yields far below 40 percent and with slow production rates. Both of these factors are responsible for high costs.

Thus, another principal object of the present invention is to provide methods for connecting the solder coated discs of stacks in a manner to obtain yields approaching 100 percent and at high production rates.

With the above objectives in mind the methods of the invention to attain these objectives will be described below in connection with the following drawings wherein.

Figures 1, 3, 4:
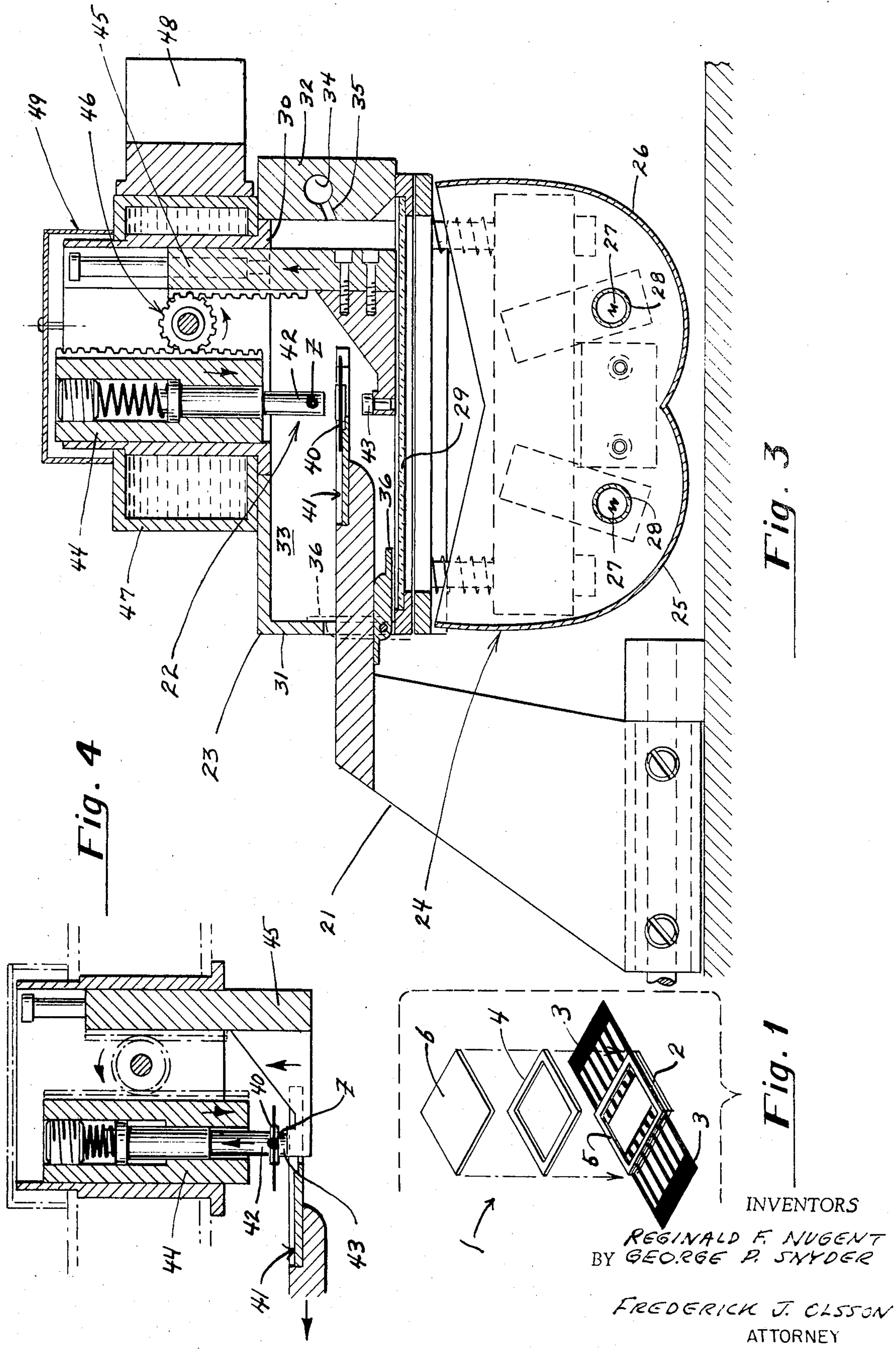
FIG. 1 is an exploded view of a typical flat pack.
FIG. 3 is a sectional elevational view of equipment for assembling flat packs.
FIG. 4 is a fragmentary view of a portion of FIG. 3.

The parts of a flat pack to be assembled for the operation to connect the base and lid and form a hermetic seal is shown in the exploded arrangement of FIG. 1.

The flat pack 1 comprises a base 2 on which there are a plurality of chips not shown interconnected to terminals 3. A solid solder preform 4 is designed to fit on the ledge 5 of the base and a lid or cover 6 fits on the preform. In lieu of a preform, solder-clad covers are also used.

The base 2, terminals 3 and cover 6 are made from metal and this type of flat pack is termed metal-to-metal. In certain instances it is desirable that the base or cover be formed from a ceramic material and in that instance a solid solder preform is also used for connecting the lid and base together. This is usually referred to as the ceramic type.

In either type of flat pack, the solder is a bonding agent which, after it is worked, bonds to the top surface 5 of the base and also bonds to the underside surface of the cover 6 and hermetically seals the flat pack.

Figures 2, 5:
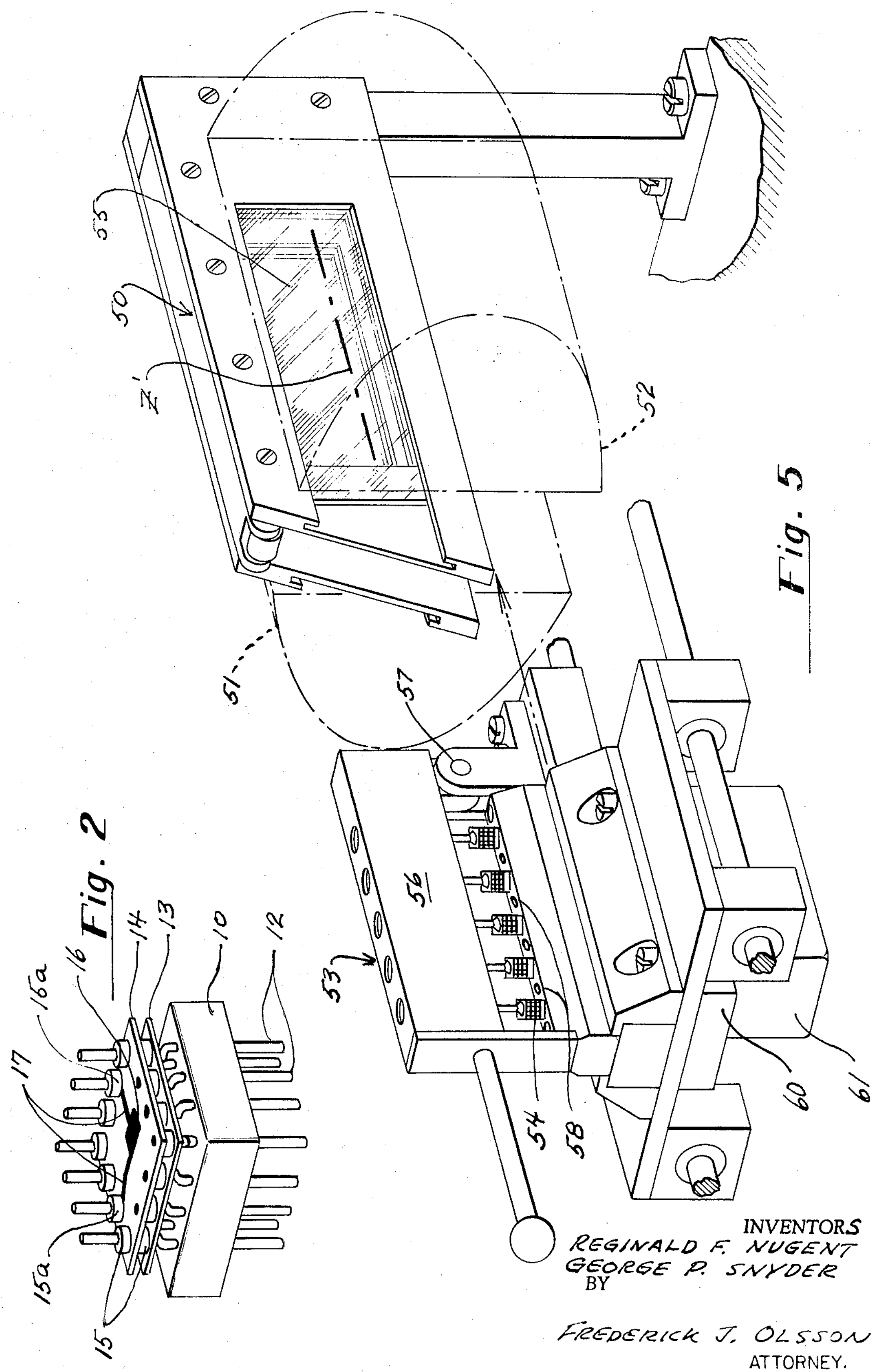
FIG. 2 is a diagrammatic view of a typical stack.
FIG. 5 is a prospective view of equipment for assembling stacks.

A typical stack, the conductors and terminal pins of which are to be connected, is diagrammatically represented in FIG. 2. The stack has a base 10 inside of which is an insulated block not shown. The conductor-terminal pins 12 are imbedded in the block and stick up through holes on top of the base. The substrates 13 and 14 are disposed on the terminal pins and are spaced from one another by the separators or spacers 15. The substrate 13 is spaced from the base by that it rests on knees formed in the terminal pins adjacent the top of the base. The substrates and spacers which are ordinarily mounted above the substrates 14 are not shown. The substrate 14 carries a chip 16 which is connected by solder conductors 17 to the spacers **15*a*. While I have shown only a single chip it will be understood that any substrate ordinarily will carry several chips with appropriate connections to terminal pins. The top most substrate is blank and does not carry chips. The spacers 15*a*** are made from copper and are solder coated. The solder on the spacers is a bonding agent which, after it is worked, bonds to the terminal pin and to the conductor. This completes an electrical connection (including the spacers) between the chip and the terminal pin. The spacers in the array which are not used for an electrical connection are formed as above or made from a non-conducting material.

In using solder as a bonding agent, it is highly desirable to eliminate the use of flux and thereby avoid the danger of contamination, etching or damage to the chips or other parts and short circuits. Etching of the chip or of its connections to the terminals will destroy the utility of the flat pack. Furthermore, with flux, parts become contaminated and the cleaning process oftentimes damages the pack. Without flux, shorts and damage is avoided as there is no danger of the solder following a running flux. This feature is very important considering the small size of components.

Thus, it is contemplated that the connection or bonding operation be carried out in an atmosphere of inert gas surrounding the flat packs or stacks. This avoids oxidation of the surfaces which would otherwise prevent the solder from bonding.

At this juncture it is to be pointed out that the invention is desirably applied to ceramic type packs wherein both the base and lid are made from ceramic material and the bonding agent is in the form of a glass frit usually on the underside of the cover. With this type of flat pack no solder is used. There is no need for an inert gas atmosphere. However, it is necessary to supply an oxidizing atmosphere for the bonding process. This may be done by carrying out the operation under ordinary room air atmosphere. In either case, it will be understood that the atmosphere surrounding the flat packs is functionally compatible with the bonding characteristics of the bonding agent.

Thus, in carrying out the method, a flat pack is assembled and positioned with the cover down. In the assembled condition the solder or glass frit is in the solid state and separates the lid from the base.

The reason for this upside-down positioning is that it avoids the possibility of any of the solder or glass frit getting to the inside of the base as might be the case if the cover were on the top side.

Where the method is used in connection with stacks, a stack is assembled to form a structure as previously described in connection with FIG. 2, the solid solder on the spacer discs simply being in non-bonded contact with the terminal pin and conductor.

Following the assembly of a flat pack or a stack as above described, the device is placed in a suitably atmosphere and subjected to both infra-red and mechanical vibratory energy as explained following.

The infra-red energy is applied to the device first in a preheat stage. The purpose of the preheat stage is to raise the temperature of the various components so as to avoid damage by thermal shock. Thus, the magnitude of the intensity is provided so that the rate of rise of temperature in each of the components and the level of temperature which each component attains is that which will avoid thermal shock damage.

A typical example of such a preheat is that a metal type flat pack approximately ⅝ × ⅝ inch in size, is raised from room temperature or about 72°F. to about 440°F. over a time period of about 15 seconds. In this way all of the components including the base, the lid, the solder and the terminals are preheated and are not thermally damaged by the rise. Preheat time for a typical stack is about 20 seconds.

After the preheating stage, the magnitude of the infra-red energy intensity is maintained or it is raised to a higher level for the purpose of causing the bonding agent to change from a solid to a liquid state. At this time (or just before or after) vibratory mechanical energy is applied to the device.

The simultaneous application of both the infra-red and mechanical energy is maintained over a time period to cause the bonding agent to flow over the surfaces on which it is to be bonded. With a metal-to-metal flat pack or stack of the kind described above, the flow stage time period for the simultaneous application of energy is about 20 seconds.

After the flow stage mentioned above, the energy application is terminated or decreased either simultaneously or one after the other. Reduction in the infra-red or its termination allows the temperature of the components and of the bonding agent to decrease so that the bonding agent is caused to solidify. As an example of the foregoing, a metal-to-metal flat pack or stack of the kind mentioned, the cooling stage to produce solidification and proper bonding runs in the order of about 30 seconds.

In connection with the bonding agent changing from solid to liquid, a holding pressure is applied to ensure that the components to be connected remain in contact with the bonding agent. Such holding pressure is ordinarily applied and maintained by a pressure developing medium, but may be supplied by the weight of the components in larger size devices. As a practical matter, the holding pressure is applied upon assembly of the device and then maintained in the preheat, flow and cooling stages.

With respect to the application of vibratory mechanical energy, it has been our experience that vibrations having a frequency of 20,000 cycles to about 100,000 cycles appears to have an ideal compatibility with the infra-red energy. It is pointed out, however, that vibrations of frequencies of less than 20,000 also have given satisfactory results, for example, vibrations having a frequency in the order of 1,000 cycles.

By satisfactory results, it is meant that the seal between the lid and base is of the type desired and will hermetically seal the flat pack. However, we feel that high order frequencies of the kind mentioned are preferable particularly from the standpoint of the time over which the infra-red and mechanical energy must be simultaneously applied to the device and there is less danger of mechanical shock.

Further, in connection with the application of mechanical vibratory energy, we have discovered that where the means for producing the vibrations incorporates a water medium, the sealing time and the desired characteristics of the bond are enhanced. We attribute this to the fact that with the water, there is a random mix of frequencies applied to the device.

We have no theoretical explanation for the surprising results attained by the simultaneous application of the infra-red and mechanical energies nor of their effect on the bonding agent and the parts to which the same is bonded. Inasmuch as we have found that applying the vibratory mechanical energy through a water medium provides excellent results and this would indicate energy resonance which somehow has the effect of causing the solder and the glass frit to flow over and to be deeply integrated with the surfaces to which it is bonded and produces mass structure (when cooled) which complements the bond and provides the highly desired hermetic seal.

Equipment or apparatus for carrying out the above described operations for both flat packs and stacks will be explained in connection with FIGS. 3 through 5. FIGS. 3 and 4 illustrate typical components of equipment for flat packs and FIG. 5 for stacks. Such equipment is described and shown in full detail in copending applications Ser. Nos. 874,505 and 874,506 both filed Nov. 6, 1969.

In FIGS. 3 and 4 a reciprocating shuttle mechanism for transporting flat packs is indicated at 21. A gripping mechanism for holding the flat packs during the connecting operation is indicated at 22. A dry box within which the gripping mechanism is disposed is indicated at 23 and the infra-red lamp means is indicated at 24.

The infra-red lamp means comprises a pair of elongated reflectors 25 and 26. For each reflector there is a hot filament within a quartz-iodine envelope. The envelopes and filaments are indicated at 27 and 28. The filaments generate radiant energy in the infra-red band and are located at the respective focal points of the reflectors. The radiant energy is reflected upwardly and concentrated at the other focal points in a tube-like area within the dry box 23. The tube-like area is effectively a three dimensional heating zone and is represented by the heavy dot Z. The concentration area or heating zone is chosen so that devices within the same are sufficiently exposed and the temperature of the components will be raised. The area Z extends longitudinally substantially at the same length as the filaments.

The reflectors are gold plated and polished to obtain maximum efficiency. It is to be noted that the infra-red energy enters the dry box 23 through the quartz plate 29 which forms the bottom of the box.

The dry box has the quartz plate 29, top 30, front 31 and back 32 and two ends, one of which is indicated at 33. The gas manifold 34 is provided in the back 32 and has passageways 35 for injecting the inert gas into the chamber. The front of the dry box carries a pivotally mounted, spring loaded door 36 which opens and closes to accommodate the shuttle. The door is shown in the open position by the full lines and in the closed position by the dotted lines.

With respect to the function of the dry box, it is to be observed that the parts are not interfitted in a manner so as to make a complete gas seal. They are fitted together sufficiently to retard the flow of gas. Thus, inert gas is injected into the dry box through the passageways 35 at a rate related to the leakage of the gas so as to ensure that the box has been purged of oxygen and is under a full complement of inert gas during the time the flat packs are receiving infra-red and mechanical energy.

The shuttle 21 is mounted for reciprocating motion (left to right) in FIG. 3. When the shuttle moves out toward the left to a load-unload position, a plurality of flat packs 40 can be disposed in the cradle means 41. The shuttle can be pushed to the right to open the door 36 and insert the flat packs into the dry box between a pair of grippers 42 and 43. The function of the grippers is to close upon the flat packs and then lift the same off the cradle and place the same within the tube-like area or energy zone Z and then hold the packs for the application of infra-red and mechanical vibratory energy.

The grippers 42 and 43 are respectively mounted on blocks 44 and 45 which are adapted to be reciprocated in opposite directions by the rack and pinion means 46. The position of the flat packs when the same are within the energy zone Z is illustrated in FIG. 4.

On top of the dry box is a circulating water chamber 47 and mounted on the water chamber is a transducer 48. The water chamber and transducer operate in a manner mentioned heretofore to cause vibratory energy to be transmitted into the grippers 42 and 43 and applied to the flat packs held therebetween. A cover 49 is disposed on top of the water jacket.

The equipment can be operated as follows. First, the shuttle is moved out to the left where the flat packs are loaded and then it is moved into the dry box positioning the flat packs between the grippers. The grippers then remove the packs from the shuttle and transport the same to the energy zone. The shuttle is moved out of the dry box and inert gas is injected to purge the chamber of oxygen so that the proper atmosphere surrounds the flat packs. The infra-red lamps and the transducer are energized to apply infra-red and vibrating mechanical energy to the flat packs. After this cycle is over the cradle is again inserted, the flat packs deposited on the same and then pulled out of the dry box for unloading the worked flat packs.

Equipment for practicing the method in connection with the assembly of stacks is shown in FIG. 5.

The equipment comprises a hollow socket 50 disposed between a pair of infra-red lamps shown by the dotted lines 51 and 52 and a reciprocating shuttle 53 carrying a plurality of stacks 54. The shuttle is adapted to be moved into the socket 50 and the two members cooperate to form a dry box enclosing the stacks.

The lamps 51–52 are similar to the lamps heretofore described and comprise a reflector and a filament within a quartz-iodine envelope. The filament is arranged at one of the focal points of the lamp and the reflector is adapted to concentrate the infra-red energy within the tube-like area or energy zone indicated by the dotted lines $Z^1$ within the socket. The infra-red energy from each lamp is transmitted into the socket by the quartz windows, one of which is indicated at 55. The arm 56 on the shuttle has a pivot connection 57 by which it can be moved into an upright position for the loading and unloading of the stacks 54. When the arm is moved down to the full line position shown it exerts pressure on the stacks and holds the same on the shuttle. The passageways 58 on the shuttle are connected to a gas manifold so that when the shuttle is within the socket, inert gas can be injected into the dry box. The shuttle carries a circulating water chamber 60 to which is secured the transducer means 61 for generating desired vibrations. The transducer and water chamber transmit vibration through the shuttle and apply the same to the stacks.

The general manner of operating the equipment is mentioned following. First, the arm 56 is moved to the upright position and stacks to be worked are loaded.

The arm is moved down to hold the stacks and the shuttle is then moved into the socket and as mentioned cooperates with the socket in forming a dry box. An inert gas atmosphere is provided in the box and the infra-red energy and the vibratory mechanical energy is then applied to the stacks. After this cycle, the shuttle is pulled out of the socket, the arm raised and the worked stacks removed and another group loaded.

We claim:

1. The method of connecting at least two components of an electronic, solid state device by a bonding agent bonded on surfaces of the two components, comprising the steps:

placing a solid state device in a position for the connection operation, the device having two components separated by a solid bonding agent which is to connect the same together;

supplying an atmosphere around the device compatible with the bonding characteristics of the bonding agent;

applying infra-red energy to the device with intensity magnitude to raise the temperature of the components of the device including the bonding agent and the components to be joined respectively at rates and to levels in a manner to pre-heat the components and avoid damage by thermal shock;

while maintaining holding pressure on the components continuing said application of said infra-red energy so that the bonding agent changes from solid to liquid and simultaneously applying vibratory mechanical energy to the device over a time period to cause the liquid bonding agent to flow over the surfaces on which the same is to be bonded;

decreasing the said intensity magnitude in the device to lower the temperature of said components and of said bonding agent to cause the agent to solidify on said surfaces and connect the two components together; and terminating said application of vibratory mechanical energy.

2. The method of connecting terminal pins and substrate conductors of a stack by solder bonded on surfaces of the pins and conductors comprising the steps:

placing a stack in position for the connection operation, the stack having a plurality of substrates supported on common terminal pins with some of the pins mounting a separator having a solder surface in engagement with a conductor on one of the substrates and in engagement with the terminal pin on which it is mounted, the solder on each said separator to be bonded to said engaged surfaces on the conductor and terminal pin to connect the conductor and pin together;

supplying an inert gas atmosphere around the stack;

applying infra-red energy to the stack with intensity magnitude to raise the temperature of the components of the stack including the solder surface on each separator and the pin and the conductor with which it is engaged respectively at rates and to levels in a manner to pre-heat the components and avoid damage by thermal shock;

while maintaining holding pressure on substrates continuing said application of said infra-red energy so that the solder changes from solid to liquid and simultaneously applying vibratory mechanical energy to the stack over a time period to cause the solder to flow over the surfaces on the conductor and on the pin with which it is to be bonded;

decreasing the intensity magnitude in the stack to lower the temperature of the solder of each separator and the temperature of the conductor and pin with which it is engaged to cause the solder to solidify and thereby electrically connect the conductor and pin together; and terminating said application of vibratory mechanical energy.

3. The method of connecting the base and the lid of a flat pack by solder bonded on surfaces thereof, comprising the steps:

placing a flat pack in position for the connection operation, the pack having a lid and a base separated by solder which is to be bonded on a surface on the lid and on a surface on the base to connect the lid and base together;

supplying an inert gas atmosphere around the device;

applying infra-red energy to the flat pack with intensity magnitude to raise the temperature of the components of the flat pack including the solder, the base and the lid respectively at rates and to levels in a manner to pre-heat the components and avoid damage by thermal shock;

while maintaining holding pressure on the base and lid continuing said application of said infra-red energy so that the solder changes from solid to liquid and simultaneously applying vibratory mechanical energy to the flat pack over a time period to cause the solder to flow over the surfaces of the base and lid on which the solder is to be bonded;

decreasing the intensity magnitude in the flat pack to lower the temperature of the base, the lid and the solder to cause the solder to solidify on said surfaces and connect the base and lid together, the connection making a hermetic seal; and terminating said application of vibratory mechanical energy.

4. The method of connecting the lid and base of a flat pack by glass frit bonded on surfaces thereof, comprising the steps:

placing a flat pack in position for the connection operation, the pack having a lid and a base separated by glass frit which is to be bonded on a surface on the lid and on a surface on the base to connect the lid and base together;

applying an atmosphere around the device;

applying infra-red energy to the flat pack with intensity magnitude to raise the temperature of the components of the flat pack including the glass frit, the base and the lid respectively at rates and to levels in a manner to pre-heat the components and avoid damage by thermal shock;

while maintaining holding pressure on the base and lid continuing said application of said infra-red energy so that the glass frit changes from solid to liquid and simultaneously applying vibratory mechanical energy to the flat pack over a time period to cause the glass frit to flow over the surfaces of the base and lid on which the glass frit is to be bonded;

decreasing the intensity magnitude in the flat pack to lower the temperature of the base, the lid and the glass frit to cause the glass frit to solidify on said surfaces and connect the base and lid together, the connection making a hermetic seal; and terminating said application of vibratory mechanical energy.

5. The method of connecting at least two components of an electronic, solid state device by a bonding agent bonded on surfaces of the two components, comprising the steps:

placing a solid state device in a position for the connection operation, the device having two components separated by a solid bonding agent which is to connect the same together;

supplying an atmosphere around the device compatible with the bonding characteristics of the bonding agent;

applying infra-red energy to the device with intensity magnitude to raise the temperature of the components of the device including the bonding agent and the components to be joined respectively at rates and to levels in a manner to pre-heat the components and avoid damage by thermal shock;

while maintaining holding pressure on the components continuing said application of said infra-red energy so that the bonding agent changes from solid to liquid and through a liquid medium simultaneously applying vibratory mechanical energy to the device over a time period to cause the liquid bonding agent to flow over the surfaces on which the same is to be bonded;

decreasing the said intensity magnitude in the device to lower the temperature of said components and of said bonding agent to cause the agent to solidify on said surfaces and connect the two components together; and terminating said application of vibratory mechanical energy.

* * * * *